United States Patent
Maltseff et al.

(10) Patent No.: US 7,249,302 B2
(45) Date of Patent: Jul. 24, 2007

(54) INTEGRATED TEST-ON-CHIP SYSTEM AND METHOD AND APPARATUS FOR MANUFACTURING AND OPERATING SAME

(75) Inventors: Paul A. Maltseff, Edmonds, WA (US); Ronald D. Payne, Snohomish, WA (US)

(73) Assignee: Intermec IP Corp., Everett, WA (US)

( * ) Notice: Subject to any disclaimer, the term of this patent is extended or adjusted under 35 U.S.C. 154(b) by 267 days.

(21) Appl. No.: 10/909,919

(22) Filed: Aug. 2, 2004

(65) Prior Publication Data
US 2005/0060627 A1 Mar. 17, 2005

Related U.S. Application Data

(60) Provisional application No. 60/492,123, filed on Aug. 1, 2003.

(51) Int. Cl.
*G01R 31/28* (2006.01)
(52) U.S. Cl. .................... 714/733; 714/703
(58) Field of Classification Search ............ 607/31, 607/2, 32; 714/733, 703; 340/539.12, 10.41
See application file for complete search history.

(56) References Cited

U.S. PATENT DOCUMENTS

| | | | | |
|---|---|---|---|---|
| 4,979,506 A * | 12/1990 | Silvian | .................. | 607/31 |
| 5,808,587 A | 9/1998 | Shima | .................. | 343/895 |
| 5,973,598 A | 10/1999 | Beigel | .................. | 340/572.1 |
| 6,294,997 B1 | 9/2001 | Paratore et al. | .................. | 340/572.1 |
| 6,429,775 B1 | 8/2002 | Martinez et al. | .................. | 340/572.1 |
| 6,499,006 B1 | 12/2002 | Rappaport et al. | | |
| 6,728,916 B2 * | 4/2004 | Chen et al. | .................. | 714/733 |
| 6,747,556 B2 * | 6/2004 | Medema et al. | .................. | 340/539.12 |
| 6,804,552 B2 * | 10/2004 | Thompson et al. | .................. | 607/2 |
| 6,882,128 B1 | 4/2005 | Rahmel et al. | | |
| 6,917,099 B2 | 7/2005 | Hellekson et al. | | |
| 6,937,150 B2 * | 8/2005 | Medema et al. | .................. | 340/539.12 |
| 7,034,660 B2 * | 4/2006 | Watters et al. | .................. | 340/10.41 |
| 7,090,471 B2 | 8/2006 | Xie et al. | | |
| 7,096,068 B2 * | 8/2006 | Mass et al. | .................. | 607/32 |

OTHER PUBLICATIONS

Charlot et al., "Electrically Induce Stimuli For MEMS Self-Test", VLSI Test Symposium, May 2001, pp. 210-215.*
U.S. Appl. No. 10/909,920, filed Aug. 2, 2004, Maltseff et al.

(Continued)

*Primary Examiner*—David Ton
(74) *Attorney, Agent, or Firm*—Seed IP Law Group PLLC

(57) ABSTRACT

A microchip system comprises a self check subsystem operable to perform a self test of at least one subsystem of the microchip system, and/or on the interoperability of subsystems. An antenna and a communications subsystem wirelessly transmit self check information from the microchip system. The communications subsystem may also receive information, data or instructions from an off-chip system or device. Self check tests may occur during manufacture of the microchip system and/or during operation. The microchip system may comprise a passive power subsystem coupled to an antenna to receive power in the form of an electromagnetic field, and which provides electrical power derived therefrom to at least one other subsystem of the microchip system.

38 Claims, 15 Drawing Sheets

OTHER PUBLICATIONS

U.S. Appl. No. 60/492,123, filed Aug. 1, 2003, Maltseff et al.
U.S. Appl. No. 60/492,125, filed Aug. 1, 2003, Maltseff et al.
MEMS and Nanotechnology Clearinghouse, "What is MEMS Technology?," retrieved Jul. 19, 2004, from http://www.memsnet.org/mems/what-is.html.
"Microfabrication Glossary," retrieved Jul. 19, 2004, from http://www.memsnet.org/glossary/.
Mohseni, K., "MicroPumps—MicroFluidics ASEN 5519," Department of Aerospace Engineering Sciences, University of Colorado at Boulder, Spring 2004.
Mutlu, S., "Microfluidic Biochemical Analysis System with Electro-Osmotic Pump and Thermally Responsive Polymer Valve," Faculty Candidate Seminar Announcement, retrieved Jul. 16, 2004, from http://www.azbio.org/news/FacultySeminar.html.
Mutlu, S., et al., "Micromachined Porous Polymer for Bubble Free Electro-Osmotic Pump," in *Proceedings of the IEEE MEMS Conference*, Las Vegas, Jan. 20-24, 2002, pp. 19-24.
Su, Y-C., et al., "A Water-Powered Osmotic Microactuator," *Journal of Microelectromechanical Systems* 11(6):736-742, Dec. 2002.
Utah State Center of Excellence for Biomedical Microfluidics, "Micro-FFF," May 11, 2004, retrieved Jul. 16, 2004, from http://www.mems.utah.edu/Project%20Pages/FFF.htm.
Utah State Center of Excellence for Biomedical Microfluidics, "Detectors," May 11, 2004, retrieved Jul. 16, 2004, from http://www.mems.utah.edu/Project%20Pages/Detector.htm.
Vennemann, P., "Micropumps—Concepts and Design Examples," TUDelft Laboratory for Aero- and Hydrodynamics, Feb. 26, 2004.

* cited by examiner

INTEGRATED TEST-ON-CHIP SYSTEM AND METHOD AND APPARATUS FOR MANUFACTURING AND OPERATING SAME

BACKGROUND OF THE INVENTION

1. Field of the Invention

This disclosure generally relates to microchip systems formed on chips or wafers, and to the manufacturing and/or operation of the same.

2. Description of the Related Art

Microchip systems are becoming increasingly complex as micro-fabrication techniques permit the formation of integrated circuits with ever decreasing dimensions, thereby allowing an ever increasing number of circuit components to be formed on a wafer or chip. The increase in complexity and the increase in the number of components also increases that probability that a fault will occur during the fabrication process, resulting in one or more faulty components, and consequently rendering the resulting microchip system unusable. This is particularly troublesome as the number of manufacturing operations increases, since significant costs will in incurred in producing an unusable product. Those costs may include lost time, money and materials used in creating the faulty microchip system, treatment and/or disposal of the resulting waste, and the reduced throughput of the expensive equipment used in the micro-fabrication process.

In a similar vein, progress in nano-technology including manufacture of MEMS devices is making sophisticated lab-on-chip systems, also known as total analysis systems (μTAS), commercially viable. Such lab-on-chip systems are one specific subset of microchip systems. Lab-on-chip technology uses integrated circuit like micro-fabrication techniques to translate experimental and analytical protocols into chip architectures, typically formed as fluid reservoirs and interconnected pathways The lab-on-chip systems typically employ one or more MEMS devices, which may take a variety of forms. For example, MEMS devices may take the form of various microfluidic devices capable of performing operations on small bodies of fluids and/or on particles suspended in a fluid, for example, a colloidal suspension. Microfluidic devices commonly employ fluids such as whole blood samples, bacterial cell suspensions, protein or antibody solutions, and various buffers, and reagents.

Microfluidic devices may include one or more channels typically with a dimension less than one millimeter, or may take the form of a channeless field or array. Microfluidic devices may employ pumps, valves, gears, electrodes and other structures, which typically have analogs on the macroscopic world, to move fluids and/or suspended particles using, for example, pressure or electrokinetic forces. The controlled movement may be employed to combine materials, divide materials, concentrate materials, direct materials to reagents, etcetera.

Microfluidic devices may be used to obtain a variety of measurements including molecular diffusion coefficients, fluid viscosity, pH, chemical binding coefficients, and enzyme reaction kinetics. Other application for microfluidic devices include capillary electrophoreses, isoelectric focusing, electrowetting, immunoassays, flow cytometry, sample injection of proteins for analysis via mass spectrometry, PCR amplification, DNA analysis, cell manipulation, cell separation, cell patterning and/or chemical gradient formation. Many of these applications have utility for clinical diagnostics.

Lab-on-chip systems may have several advantages over conventional laboratory systems. For example, such systems typically have a smaller physical footprint than standard laboratory setups, and have low power consumption. Micro-fabrication techniques permit simplified manufacturing and superior reproducibility, reducing costs. Lab-on-chip systems also provide the ability to work with very small volumes of samples, agents, reagents or other materials. This lowers the cost of materials, permits smaller samples to be taken from test subjects, such as patients, and also reduces disposal costs. Lab-on-chip systems may enhance automation leading to lower costs, higher throughput and more consistent results.

There is still significant room for improvement in the structure of lab-on-chip systems, and in the manufacture and operation of such device. Such improvements may be directed at reducing the cost of such devices, and making the devices more reliable and easier to manufacture and/or operate.

BRIEF SUMMARY OF THE INVENTION

In one aspect, a microchip system comprises a substrate; a control subsystem carried by the substrate and operable to perform a self test of at least one subsystem of the microchip system; an antenna; and a communications subsystem carried by the substrate, the communications subsystem coupled to the antenna and operable to wirelessly transmit self check information resulting from the self test of at least one subsystem from the microchip system. The control subsystem may be operable to perform a self test on itself or on another subsystem during manufacturing of the microchip system. The control subsystem may be operable to perform a self test on itself or on another subsystem after manufacturing such as in an operation environment, for example, a laboratory environment while performing an experiment. The microchip system may comprise a communications subsystem to transmit information or data from the microchip system and/or receive information, data or instructions from an off-chip system or device. The microchip system may comprise a passive power subsystem coupled to an antenna to receive power in the form of an electromagnetic field and coupled to provide electrical power derived therefrom to at least one other subsystem of the microchip system.

In another aspect, a method of operating a microchip system comprises performing at least a first self check test of at least one subsystem at a first time with a control subsystem carried by the substrate; and wirelessly transmitting results of the first self check test from the microchip system. Self check tests may be executed during manufacturing of the microchip system, for example after each completion of each subsystems. Self check tests may be executed during operation of the microchip system, such as in an operating environment, for example, in a laboratory environment. Self check tests may be executed on the interoperability of various subsystems during manufacture and/or after manufacture.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn, are not intended to convey any information regarding the actual shape of the particular elements, and have been solely selected for ease of recognition in the drawings.

DETAILED DESCRIPTION OF THE INVENTION

In the following description, certain specific details are set forth in order to provide a thorough understanding of various embodiments of the invention. However, one skilled in the relevant art will recognize that the invention may be practiced without one or more of these specific details, or with other methods, components, materials, etc. In other instances, well-known structures associated with microchips, lab-on-chip systems, micro-electrical-mechanical structure (MEMS) such as microfluidic devices, controllers, transmitters, receivers, transceivers and passive power supplies, and methods of manufacturing and operating same have not been shown or described in detail to avoid unnecessarily obscuring descriptions of the embodiments of the invention.

Unless the context requires otherwise, throughout the specification and claims which follow, the word "comprise" and variations thereof, such as, "comprises" and "comprising" are to be construed in an open, inclusive sense, that is as "including, but not limited to."

Figure 1A:
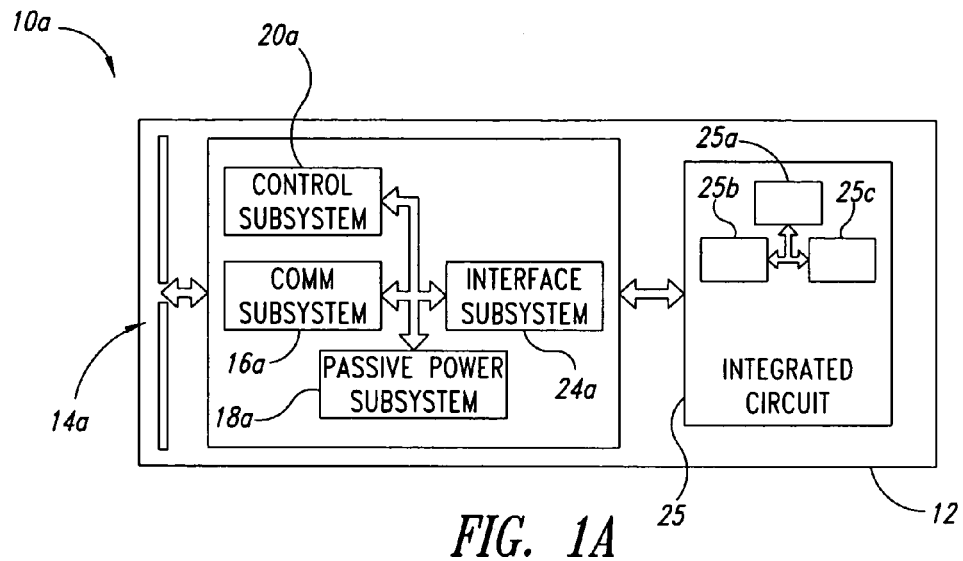
FIG. 1A is a functional block diagram of a microchip system according to one illustrated embodiment.

FIG. 1A shows a microchip system 10a according to one illustrated embodiment where one or more subsystems are integrally formed on a substrate 12. The substrate 12 may comprise one or more layers of various materials for example: insulators or dielectrics such as glass, ceramic and/or polycrystalline silicon; conductors such as copper, gold, silver, and/or aluminum; and/or semiconductors such as doped silicon, germanium, gallium arsenide and/or gallium arsenide phosphide.

The microchip system 10a includes a variety of subsystems to handle various aspects of operation. The microchip 10a may include one or more antennas 14a and communications subsystems 16a coupled to the antenna 14a to provide wireless communications from and/or to the microchip 10a. The antenna 14a may be formed as one or more conductive traces formed on the substrate 12. The conductive traces may be formed, for example, by depositing and/or etching using standard printed circuit board and/or micro-fabrication techniques (e.g., techniques employed in fabrication of integrated circuits and/or micro-electrical-mechanical structure (MEMS)). While illustrated as a dipole antenna 14a, the antenna may take a variety of forms, for example a coil antenna or Yagi antenna, depending on the particular environment and application in which the lab-on-chip will be used.

Figure 2:
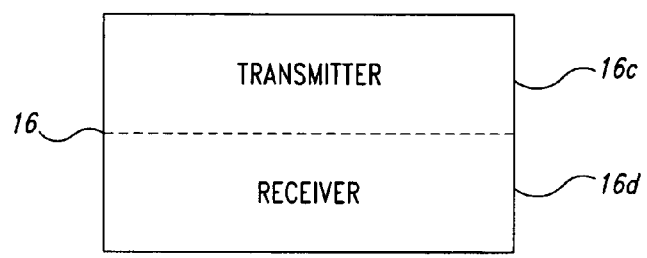
FIG. 2 is a functional block diagram of a communications subsystem according to one illustrated embodiment, for use with the microchip system of FIGS. 1A, 1B, 3A and 3B.

The communications subsystem 16a may likewise be integrally formed on the substrate 12 using standard printed circuit board and/or micro-fabrication techniques. In the embodiment illustrated in FIG. 1A, the communications subsystem is formed as a communications circuit such as those commonly associated with passive radio frequency identification (RFID) tags or passive store security tags. In another embodiment illustrated in FIG. 2, the communications subsystem may comprises a transmitter 16c and/or receiver 16d. The transmitter 16c and receiver 16d may be formed individually, or may be formed as a transceiver 16.

The microchip system 10a may also include a passive power subsystem 18a which may be integrally formed on the substrate 12 using standard printed circuit board and/or micro-fabrication techniques. The passive power subsystem 18a is so denominated because it derives electrical power from electromagnetic fields, for example RF signals, wirelessly received at the antenna 14a and provides the electrical power to operate one or more of the other subsystems. The passive power subsystem 18a may include a voltage rectifier and/or energy storage device such as a capacitor or ultra capacitor. The passive power subsystem 18a may employ various circuitry and/or techniques from the field of radio frequency identification (RFID) such as those taught in U.S. Pat. No. 6,429,775; U.S. Pat. No. 5,808,587; and/or U.S. Pat. No. 5,973,598 for deriving power from the wireless signals.

The microchip system 10a may further include a control subsystem 20a which may be integrally formed on the substrate 12 using standard printed circuit board and/or micro-fabrication techniques. At a minimum, the control subsystem 20a executes self check tests of one or more subsystems, and may even perform a self check test on the control subsystem 20a itself. In some embodiments, the control subsystem 20a may also control the operation of one or more of the other subsystems. The control subsystem 20a may provide results of one or more self check tests from the microchip system 10a via the communications subsystem 16a and antenna 14a.

The control subsystem 20a may be hardwired in a fashion similar to an application specific integrated circuit (ASIC). Alternatively, the control subsystem 20a may take a form similar to a microcontroller or microprocessor, executing instructions provided in a program or other software routine. The instructions may be stored in a nonvolatile and/or volatile memory, such as a register, read only memory (ROM) and/or random access memory (RAM), which may or may not form a portion of the control subsystem 20a. The memory may be preconfigured or preprogrammed with instructions and/or may receive instructions via the antenna 14a and communications subsystem 16a.

The microchip system 10a may optionally include an interface subsystem 24a to interface which may be integrally formed in the substrate 12 using common printed circuit board and/or micro-fabrication techniques. The interface subsystem 24a interfaces with one or more subsystems 25a, 25b, 25c of an integrated circuit system 25. The subsystems 25a–25c of the integrated circuit 25 may, for example, take the form of a central processor, an internal communications bus controller, a video controller, an external input/output controller such as an Ethernet controller, or any other integrated circuit suitable for manufacture as a subsystem.

Figure 1B:
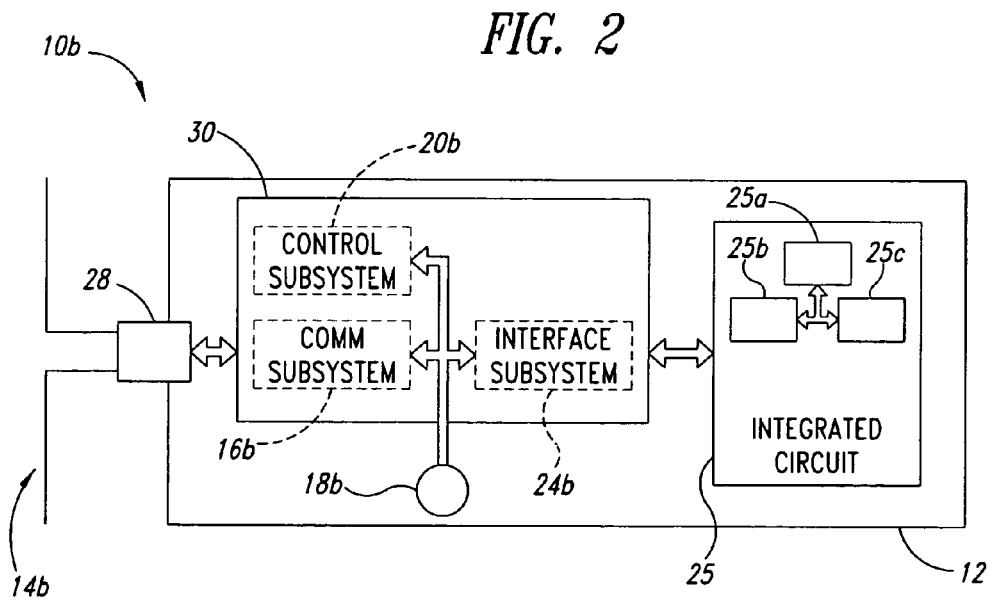
FIG. 1B is a functional block diagram of a microchip system according to one illustrated embodiment.

FIG. 1B shows a microchip system 10b according to another illustrated embodiment in which one or more subsystems are discretely formed as one or more separate wafers or chips 30, which are placed, soldered or otherwise located on the substrate 12. The wafer(s) or chip(s) 30 may be packaged or unpackaged, and may be mounted to the substrate 12 using any of a variety of mounting techniques, for example, via flip chip techniques.

The wafer or chip 30 may be physically and/or logically partitioned into separate subsystems, illustrated by the use of broken line in FIG. 1B, such as a communications subsystem 16b, control subsystem 20b, and interface subsystem 24b. Alternatively, each subsystem 16b, 20b and 24b may be provide on individual wafers or chips, or one two or more wafers or chips. The microchip system 10b may include a communications port 28 to physically and communicatingly couple an off-substrate antenna 14b to the communications subsystem 16b carried by the substrate 12.

The microchip system 10b may employ a discrete power source 18b such as one or more battery cells and/or ultra capacitors. The discrete power source 18b may take the place of the passive power subsystem 18a (FIG. 1A) or may be provided in addition to the passive power subsystem 18a.

This alternative embodiment, and those alternative embodiments and other alternatives described herein, are substantially similar to previously described embodiments, and common acts and structures are identified by the same reference numbers.

Figure 3A:
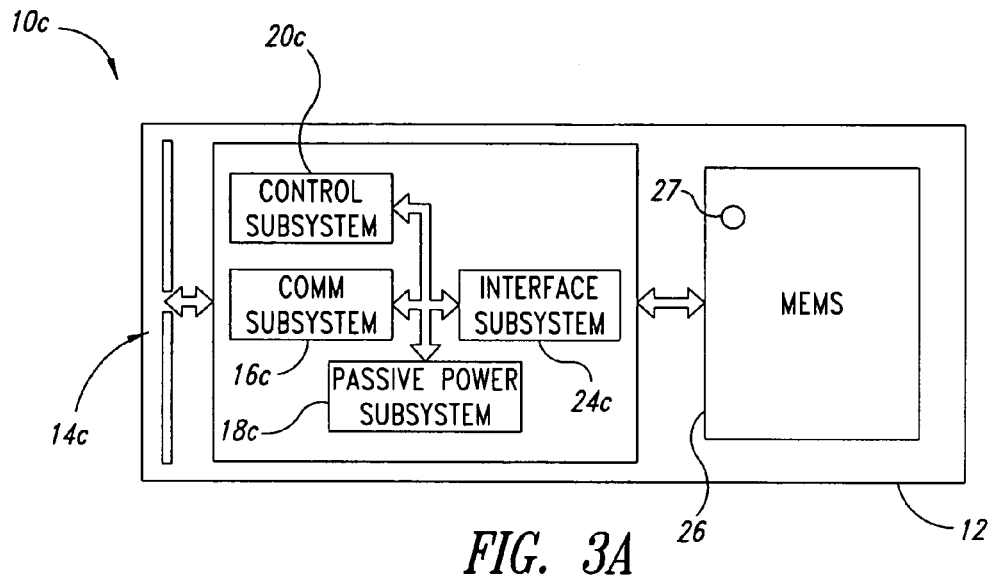
FIG. 3A is a functional block diagram of a microchip system according to another illustrated embodiment.

FIG. 3A shows a microchip system 10c in the form of a lab-on-chip system according to one illustrated embodiment. Some of the structures and operations of the microchip system 10c are similar to those of the microchip system 10a (FIG. 1A). In particular, the antenna 14c, communications subsystem 16c, passive power subsystem 18c, control subsystem 20c and/or interface subsystem 24c may be formed in an identical or similar manner to the corresponding structures of the microchip system 10a (FIG. 1A), and may operate in an identical or similar manner to those corresponding structures. Only significant differences in structure and operation are described below In contrast to the microchip systems 10a, 10b (FIGS. 1A and 1B), the microchip system 10c includes one or more MEMS devices 26, for example, pumps, valves, electrodes, channels, sensors 27 and/or other transducers. These MEMS devices 26 may take the place of, or be in addition to, the subsystems 25a–25c of the integrated circuit 25 (FIGS. 1A and 1B). Some specific examples of MEMS devices 26 are discussed below with reference to FIGS. 5–9.

Figure 3B:
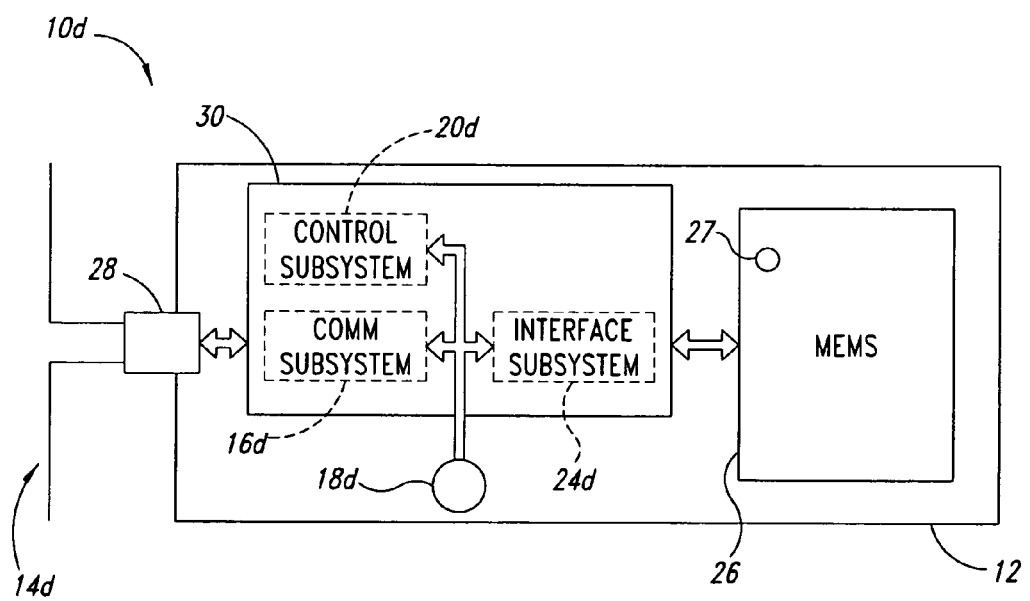
FIG. 3B is a functional block diagram of a microchip system according to another illustrated embodiment.

FIG. 3B shows a microchip system 10d in the form of a lab-on-chip system according to another illustrated embodiment. Some of the structures and operations of the microchip system 10d are similar to those of the microchip system 10b (FIG. 1B). In particular, the antenna 14d, communications subsystem 16d, discrete power source 18d, control subsystem 20d and/or interface subsystem 24d may be formed in an identical or similar manner to the corresponding structures of the microchip system 10b (FIG. 1B), and may operate in an identical or similar manner to those corresponding structures.

The microchip system 10d also includes one or more MEMS devices 26 identical or similar to those of the microchip 10c (FIG. 3A). Such structures are identified in FIG. 3B with the same reference numbers as used in FIG. 3A.

Figure 4:
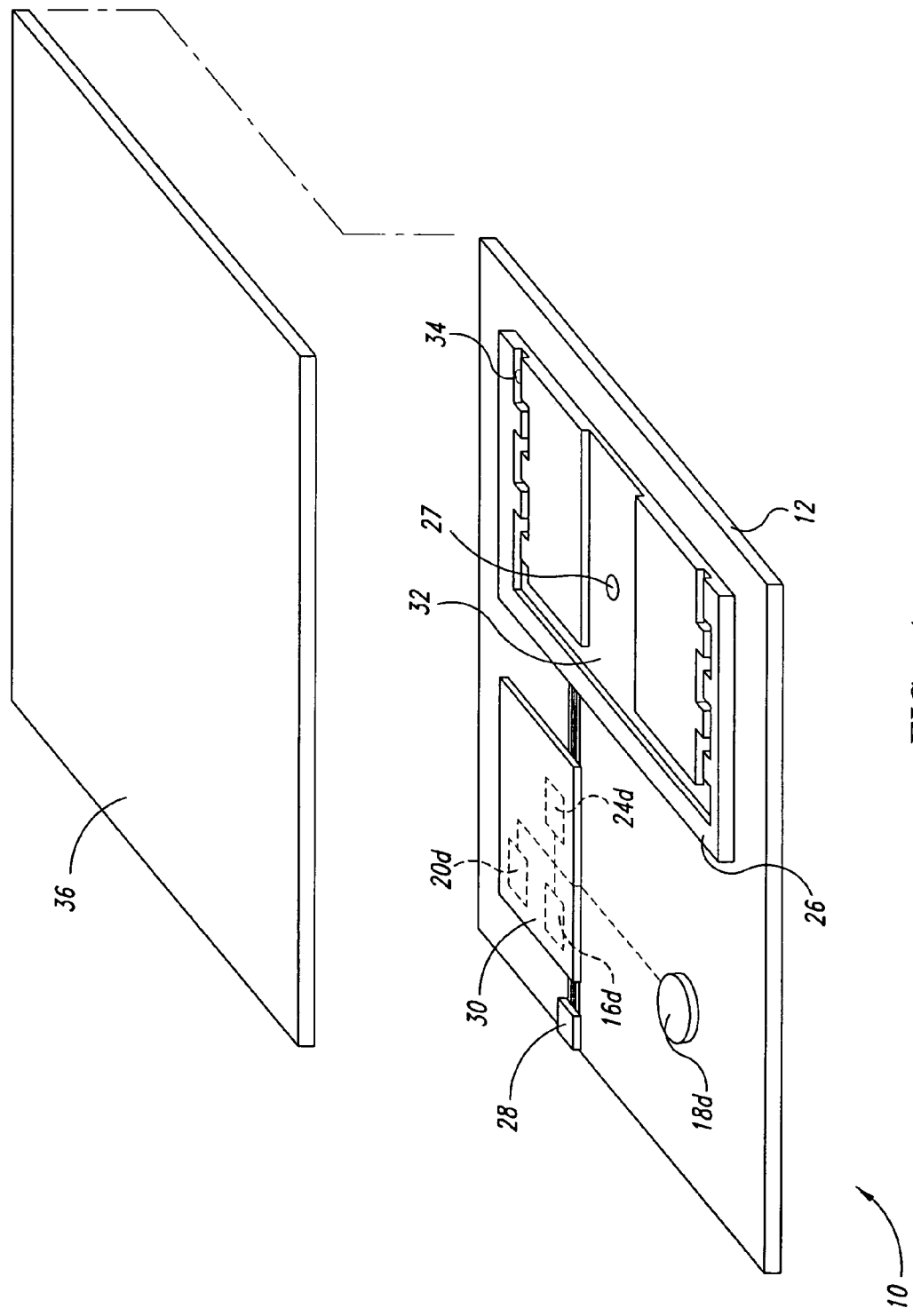
FIG. 4 is a top isometric partially exploded view of a lab-on-chip system of FIGS. 3A and 3B.

As best illustrated in FIG. 4, the substrate 12 may carry one or more MEMS devices 26. The MEMS devices 26 may, for example, include one or more channels 32 formed in one or more layers of the substrate 12. The channels 32 may be formed to contain and/or direct movement of one or more fluid bodies 34 as is commonly understood in the field of MEMS technology and particularly in the field of microfluidic technology. The microchip system, for example the microchip system 10d illustrated in FIG. 4 may include a cover 36 to at least partially enclose the channel 32 and/or protect elements of the various subsystems or buses interconnecting the various subsystems. The cover 36 may take the form of glass or another insulative material, and may or may not be transparent.

The MEMS devices 2.6 may include one or more sensors 27 operable to sense or detect one or more operating characteristics of one or more MEMS devices and/or one or more physical characteristics of the work product. The sensors may take a variety of forms. For example, rotational encoders and/or optical sensors may be employed to detect the movement and/or position of work products such as fluid bodies, agents, reagents, and/or samples. Rotational encoders and/or optical sensors may additionally or alternatively be employed to detect the movement and/or position of various components of the MEMS devices such as gears, valves and/or actuators. Likewise, inductive sensors similar to those employed in touch screen devices may be employed to detect movement, position, and/or pressure of one of the work products or MEMS devices. Further, chemical sensors may be employed to, for example, detect the occurrence or results of a chemical or biological reaction. Accelometers may be employed to detect the rate of change or force of a work product or MEMS device. Voltage sensors, current sensors, resistivity sensors may be employed to detect various electrical characteristics of one or more work products and/or one or more MEMS devices. As will be readily apparent to those of ordinary skill in the art, the types of sensors should not be limited to those disclosed herein.

Figure 5:
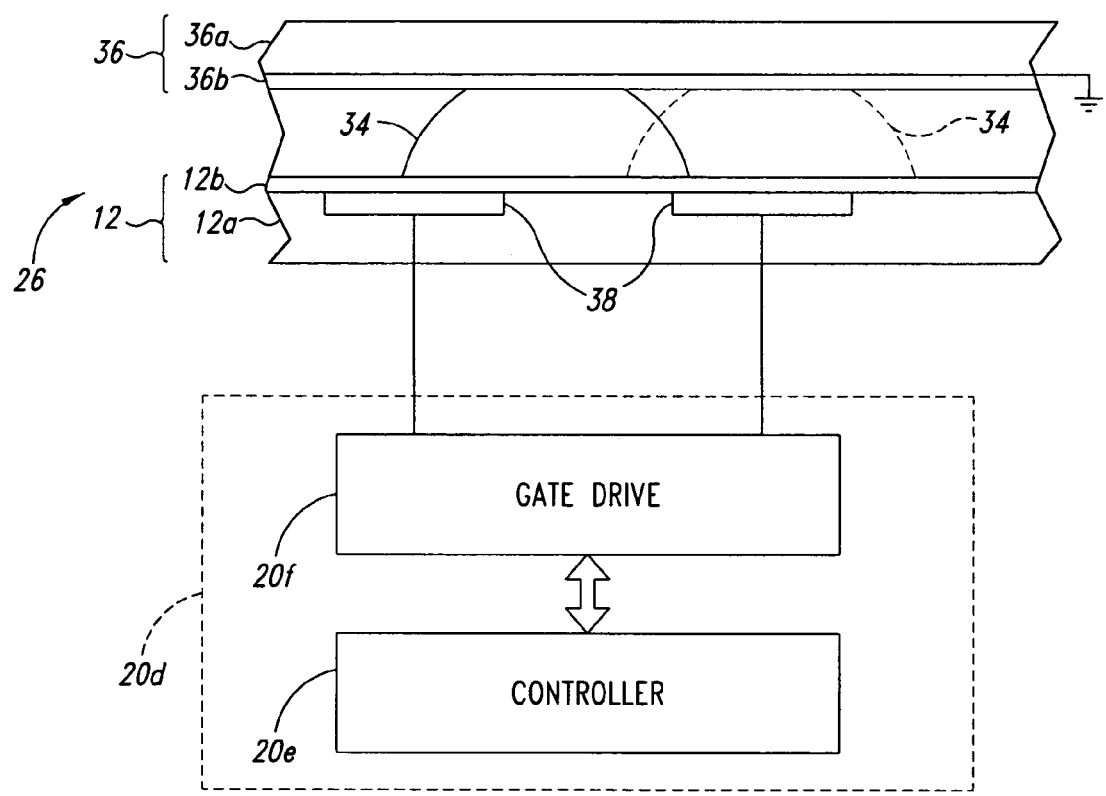
FIG. 5 is partially a cross-sectional view of a MEMS device in the form of an array of electrodes suitable for use in electro-wetting, and partially a functional block diagram of a control subsystem coupled to control operation of the MEMS device according to one illustrated embodiment.

FIG. 5 shows an embodiment of a MEMS device 26 particularly useful in microfluidics operations such as electrowetting. The MEMS device 26 comprises a plurality of electrodes 38 spaced about a portion of the substrate 12 and selectively actuable to apply a potential to a portion of the fluid body 34. The substrate 12 may comprise one or more layers, for example a base 12a and a fluid compatability coating or layer 12b. The fluid compatability layer 12b may comprise a hydrophobic material to achieve the desired interaction between the fluid body 34 and the substrate 12, for example, to achieve a desired contact angle between the fluid body 34 and the substrate 12. The hydrophobic material may be a dielectric, and may overlay the electrodes 38 to electrically insulate the same. In some embodiments, the fluid compatablity layer 12b may alternatively comprise a hydrophilic material, which may or may not constitute a dielectric.

The cover 36 may comprise one or more layers, for example glass 36a and a conductive layer 36b such as transparent Indium Tin Oxide ("ITO") which may serve as a ground electrode to provide a ground potential to the fluid body 34. The control subsystem collectively referenced as 20 may include a controller 20e to control the operation of the electrodes 38 and gate drive circuitry 20f to transform the instructions from the controller 20e to drive signals to drive individual ones of the electrodes 38. By sequentially activating electrodes 38, the fluid body 34 can be moved from a first position (shown in solid line) to a second position (shown in broken line).

Figure 6:
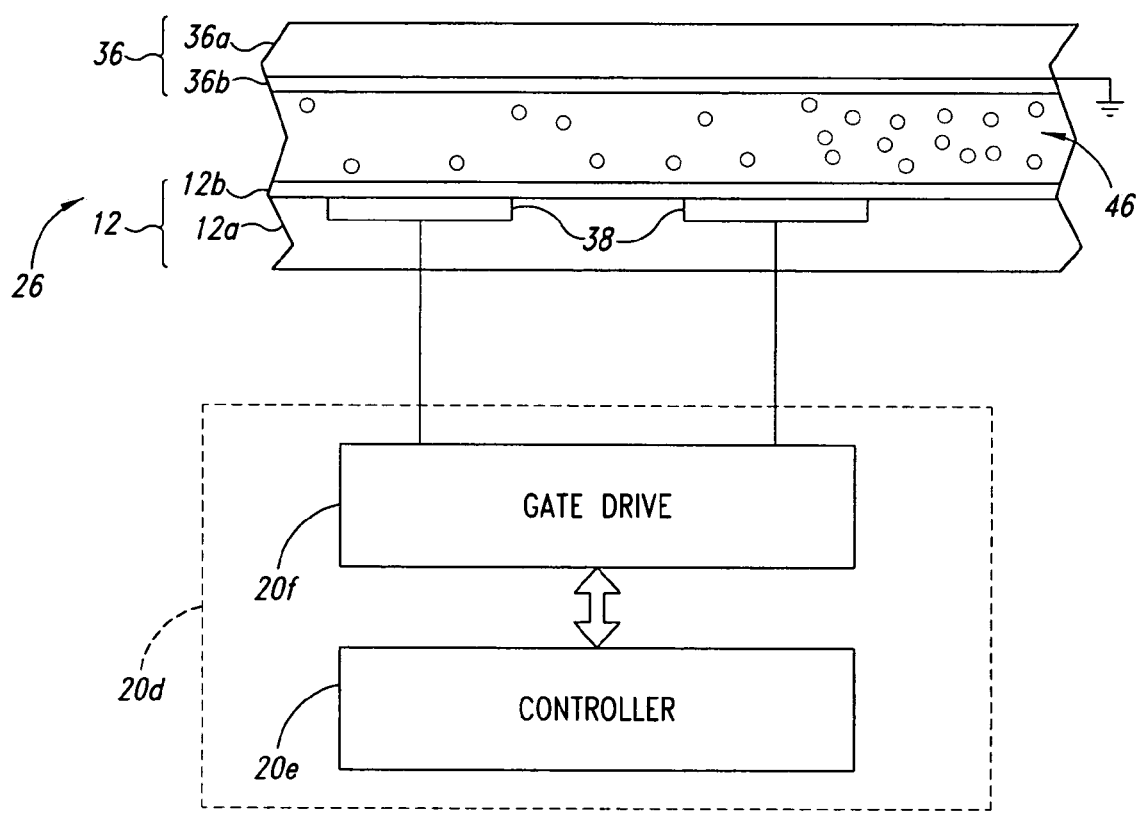
FIG. 6 is partially a cross-sectional view of a MEMS device in the form of an array of electrodes suitable for use in electrophoreses and partially a functional block diagram of a control system coupled to the control the array of electrodes according to another illustrated embodiment.

FIG. 6 shows another MEMS device 26 particularly useful in microfluidics operations such as electrophoreses. Many of the elements of FIG. 6 are similar or analogous to the elements of FIG. 5 so will not be discussed in detail. The fluid body 34 includes one or more particles 46 suspended in the fluid body 34, such as in a colloidal suspension. Activation of the electrodes 38 may cause the particles 46 to migrate through the fluid body 34, as is commonly known in electrophoreses.

Figure 7:
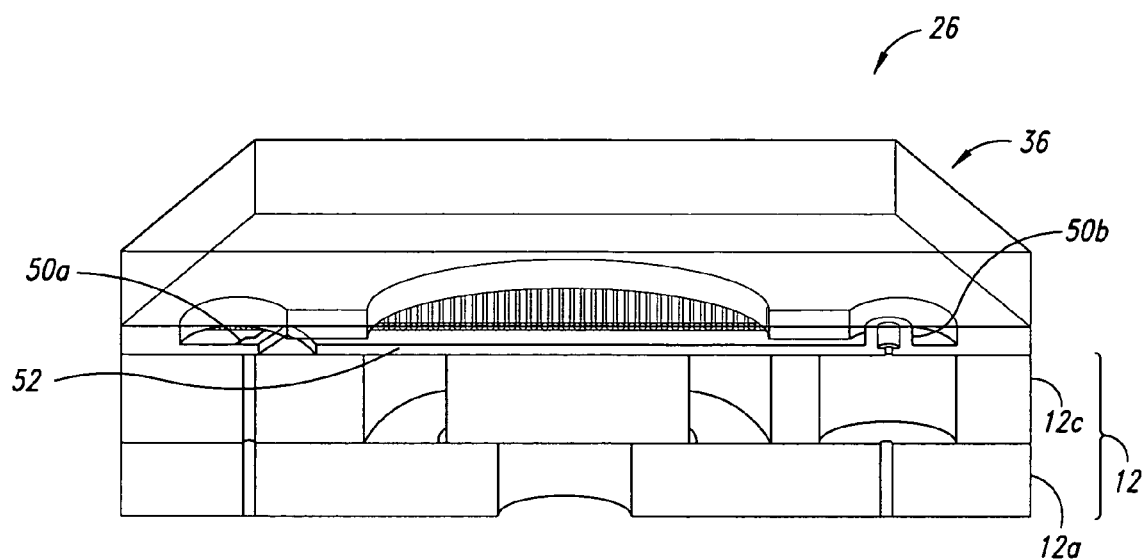
FIG. 7 is a cross-sectional view of a MEMS device in the form of a check valve according to one illustrated embodiment.

FIG. 7 shows a further embodiment of the MEMS device 26 in the form of a silicon check valve pump. A lower portions 12a of the substrate 12 may support a patterned layer 12c to form an inlet valve 50a and an outlet valve 50b which cooperates with a silicon member 52 to form the silicon check valve pump.

Figure 8:
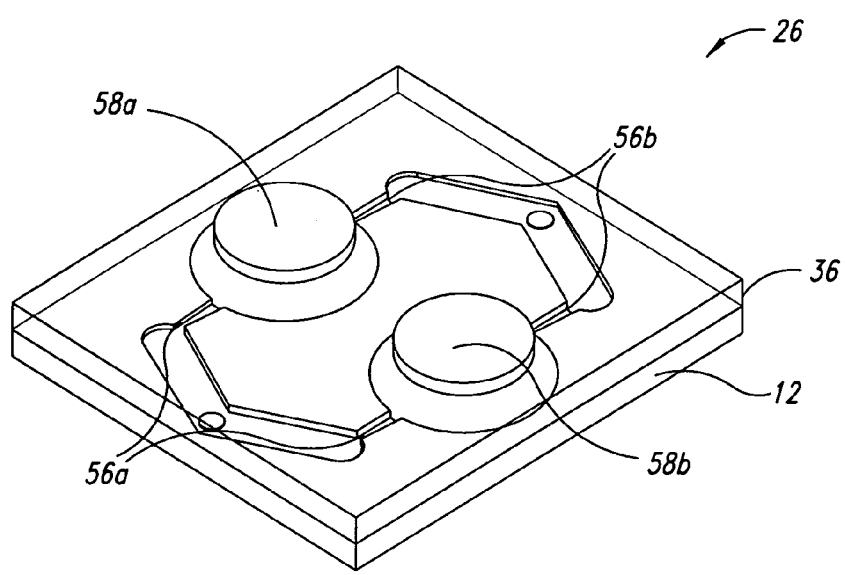
FIG. 8 is an isometric view of a MEMS device in the form of a fixed geometry valve pump according to another illustrated embodiment.

FIG. 8 shows still a further embodiment of a MEMS device 26 in the form of fixed geometry valve pump. The substrate 12 is patterned to form a number of channels defining inlet diffuser elements 56a and outlet diffuser elements 56b. A pair of piezoelectric drive disks 58 are operable to pump fluid from the inlet diffuser elements to the outlet diffuser elements 56b.

Figure 9:
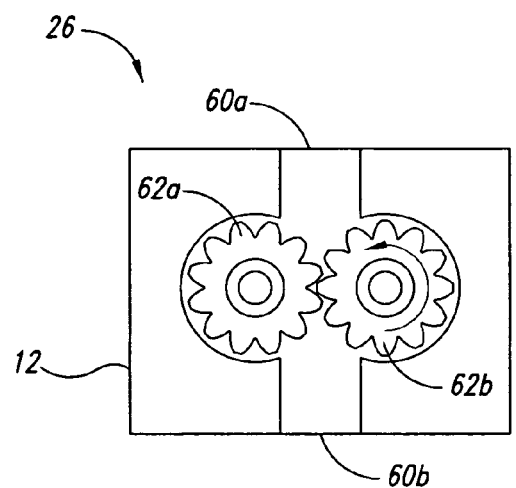
FIG. 9 is a top plan view of a MEMS device in the form of a microgear pump according to a further illustrated embodiment.

FIG. 9 shows yet a further MEMS device 26 in the form of a micro-gear pump. The substrate 12 is patterned to form an inlet 60a and an outlet 60b with a channel extending therebetween. The pair of intermeshing gears 62a, 62b are electromagnetically operable to move fluid from the inlet 60a to the outlet 60b.

Figure 10:
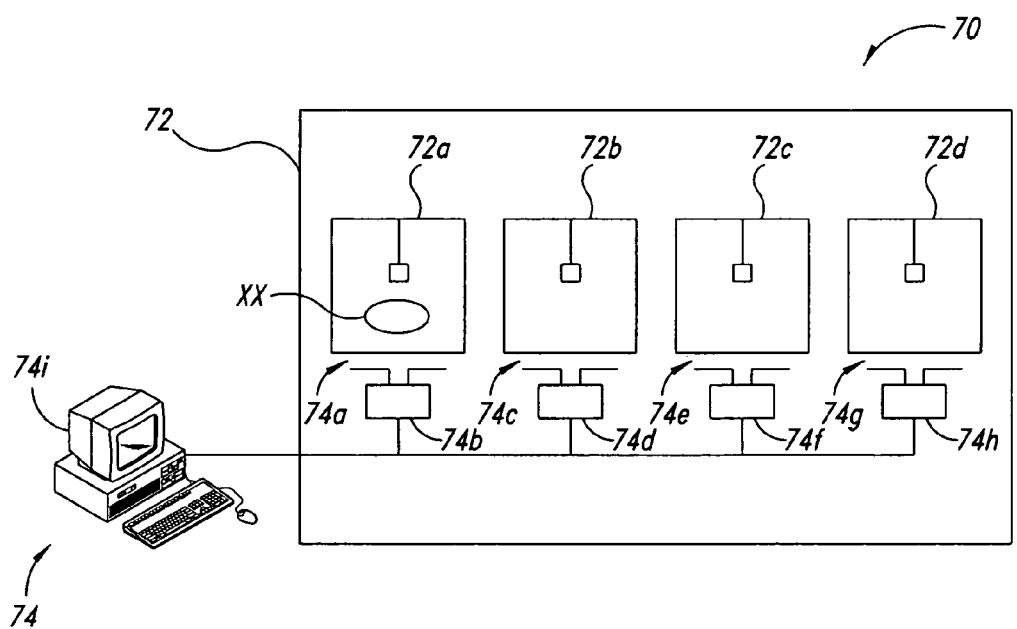
FIG. 10 is a schematic diagram of a manufacturing environment to manufacture the microchip systems according to one illustrated embodiment.

FIG. 10 shows a manufacturing environment 70 suitable for manufacturing microchip systems 10a–10d (collectively 10) according to one illustrated embodiment.

The manufacturing environment 70 may include one or more clean rooms 72 housing manufacturing equipment such as equipment typically associated with the microfabrication industry. One or more depositioning devices 72a may be employed for depositing various layers on the substrate 12. One or more masking devices 72b may be employed for masking various layers of the substrate 12. One or more etching devices 72c may be employed for etching the various layers of the substrate 12. One or more cutting devices (not shown) may be employed for cutting the substrate 12 or a wafer in which the substrate resides. One or more pick and place devices 72d may be employed to automatically pick packaged or unpackaged chips and place the chips on the substrate 12. While only a single instance of each type of manufacturing device 72a–72d is illustrated, many manufacturing environments may contain multiple instances of any of the manufacturing devices 72a–72d. During fabrication, a substrate 12 may return to the same manufacturing device 72a–72d multiple times.

A manufacturing control system 74 may control operation of one or more of the manufacturing devices 72a–72d. In particular the manufacturing control system 74 may include one or more antennas, transmitters, receivers, or transceivers positioned throughout the clean room 72. For example, a first antenna 74a and/or transceiver 74b may be positioned proximate or otherwise associated with the depositioning device 72a. A second antenna 74c and/or transceiver 74d may be positioned proximate or otherwise associated with the masking device 72b. A third antenna 74e and/or transceiver 74f may be positioned proximate or otherwise associated with the etching device 72c. A fourth antenna 74g and/or transceiver 74h may be positioned proximate or otherwise associated with the pick and place machinery 72d.

The manufacturing control system 74 may also include one or more manufacturing computing systems 74i. The transceivers 74b, 74d, 74f, 74h may provide signals or information received from the microchip systems 10 to the computing system 74i. The transceivers 74b, 74d, 74f, 74h may additionally, or alternatively provide signals or information received from the manufacturing computing system 74i to the microchip systems 10. The manufacturing computing system 74i may be programmed to control manufacturing operation based on the information received from the individual microchip systems 10, for example, the results of self check tests performed on the various microchip systems 10.

While FIG. 10 illustrates a one-to-one pairing between the manufacturing devices 72a–72d and antenna and transceiver combinations, other topologies are of course possible. The particular typology will depend on the particular layout of the manufacturing environment 70 as well as the signal strength of antennas and transceivers of both the manufacturing control system 74 and the microchip systems 10.

Figure 11:
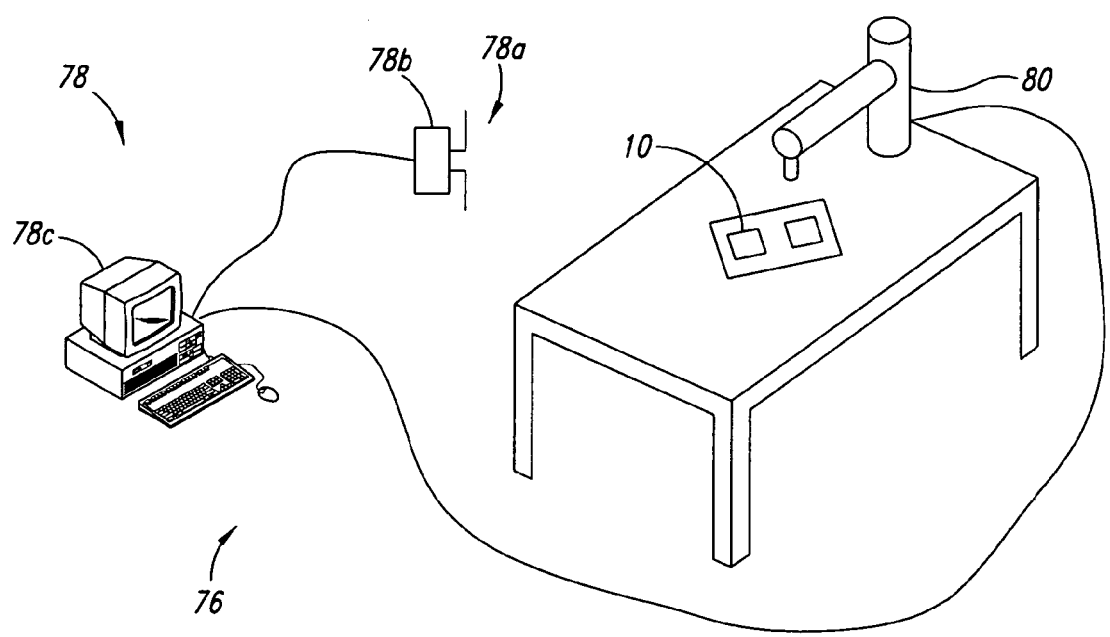
FIG. 11 is a schematic diagram of a laboratory or other facility in which lab-on-chip systems are used according to another illustrated embodiment.

FIG. 11 shows a operational environment 76 such as a laboratory or other environment suitable for using the microchip systems 10. The environment 76 may include an analysis system 78 to analyze information resulting from operation of the microchip system 10. The analysis system 78 may include one or more antennas 78a positioned to communicate with the microchip 10, one or more transmitters, receivers, or transceivers 78b communicatingly coupled to the antenna 78a, and one or more analysis computing systems 78c coupled to receive and process information received from the microchip systems 10 via the antenna 78 and transceiver 78b. The analysis computing system 78c may include one or more programs for analyzing data collected by the microchip system 10. The operational environment 76 may also include one or more automated devices 80 operable to physically interact with the microchip system 10. For example, the automated device 80 may provide agents, reagents, samples or other materials to the microchip system 10, for example, via a pipette array dispenser. The automated device 80 may be under control of the analysis computing system 78c, or may be operated independently thereof. The automated device 80 may further include sensors such as optical devices to sense various physical characteristics of the microchip system 10.

Figure 12A:
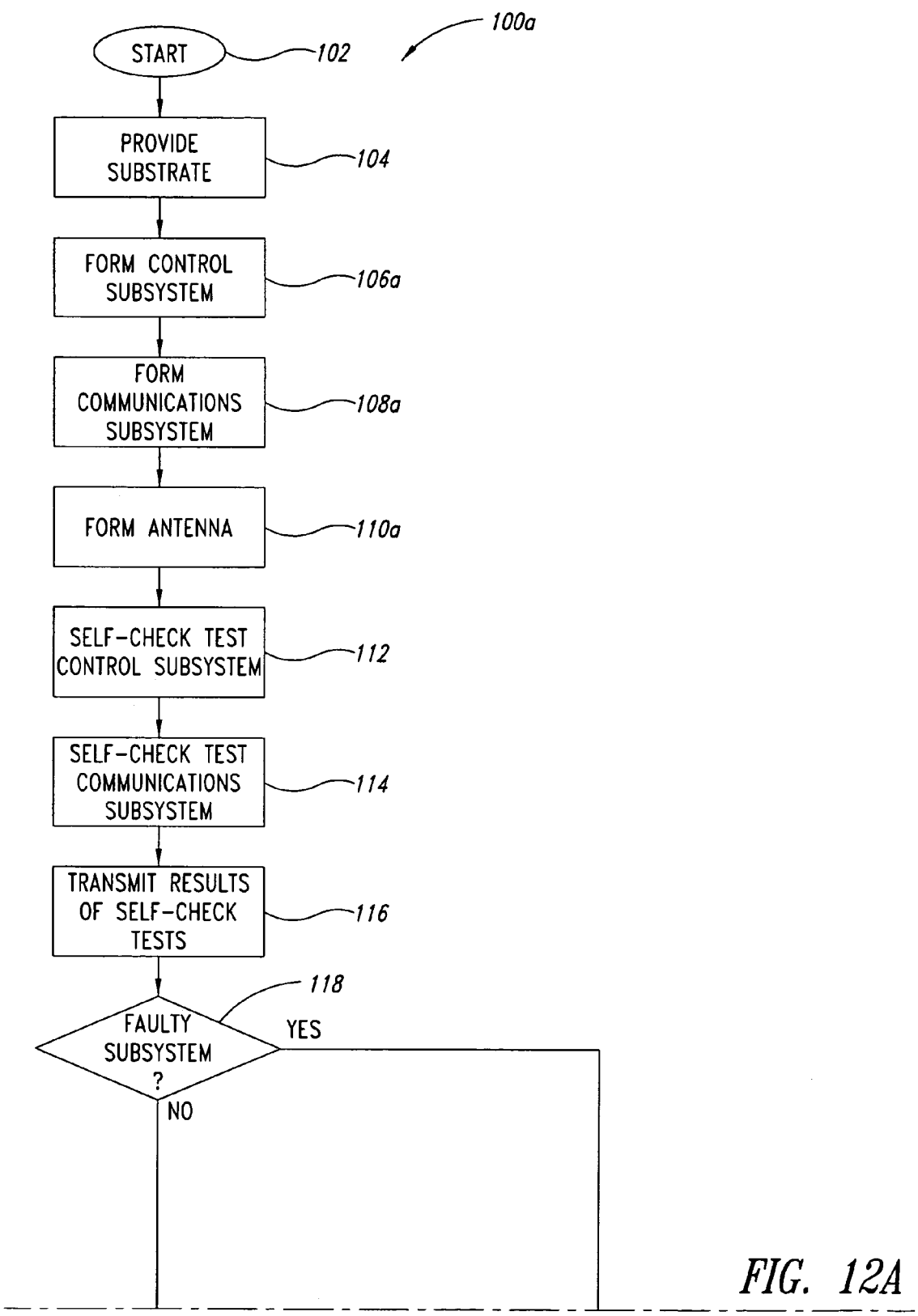
FIGS. 12A–12C are a flow diagram of a method of manufacturing a microchip system of FIGS. 1A and 1B according to one illustrated embodiment.
Figure 12B:
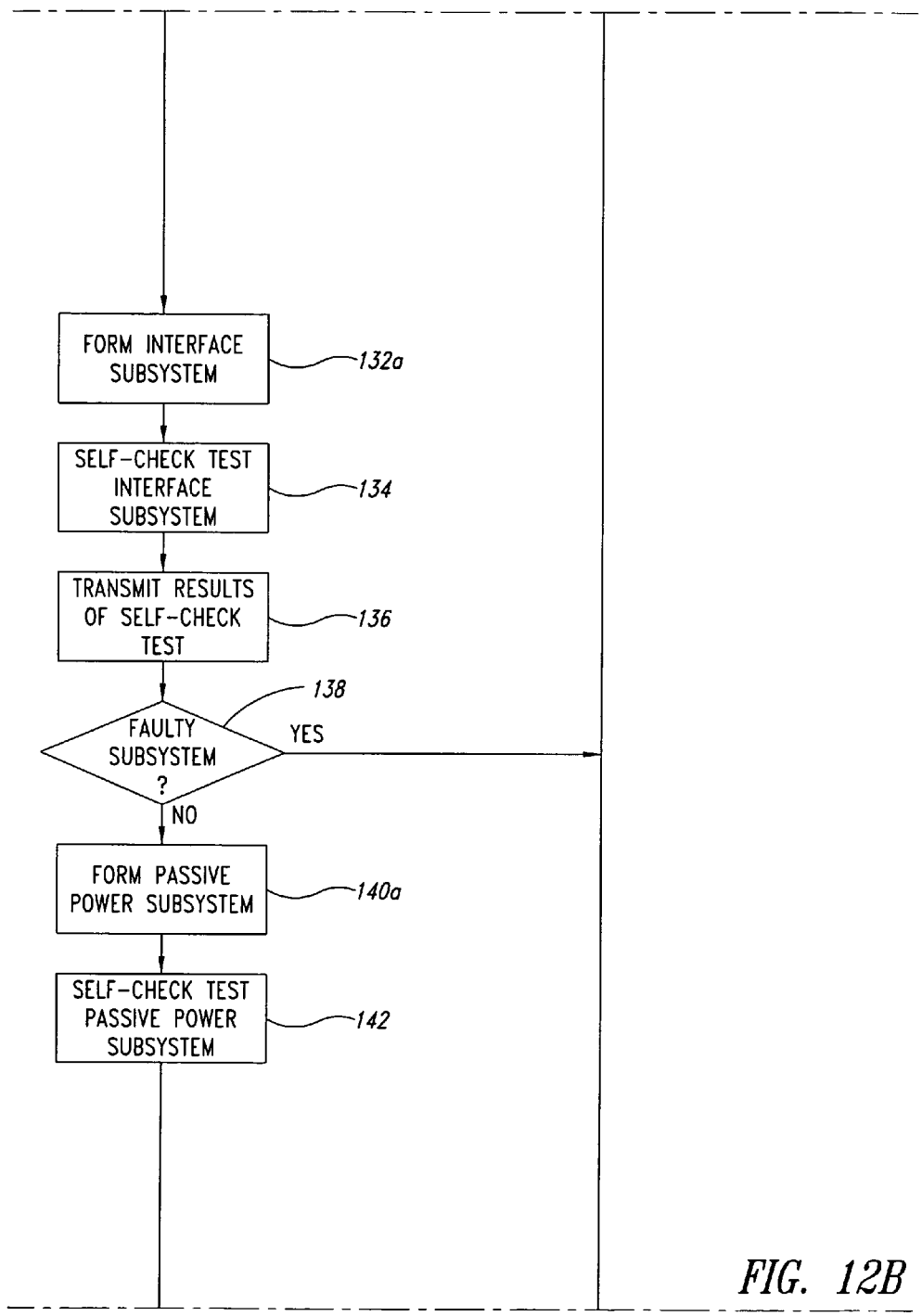
Figure 12C:
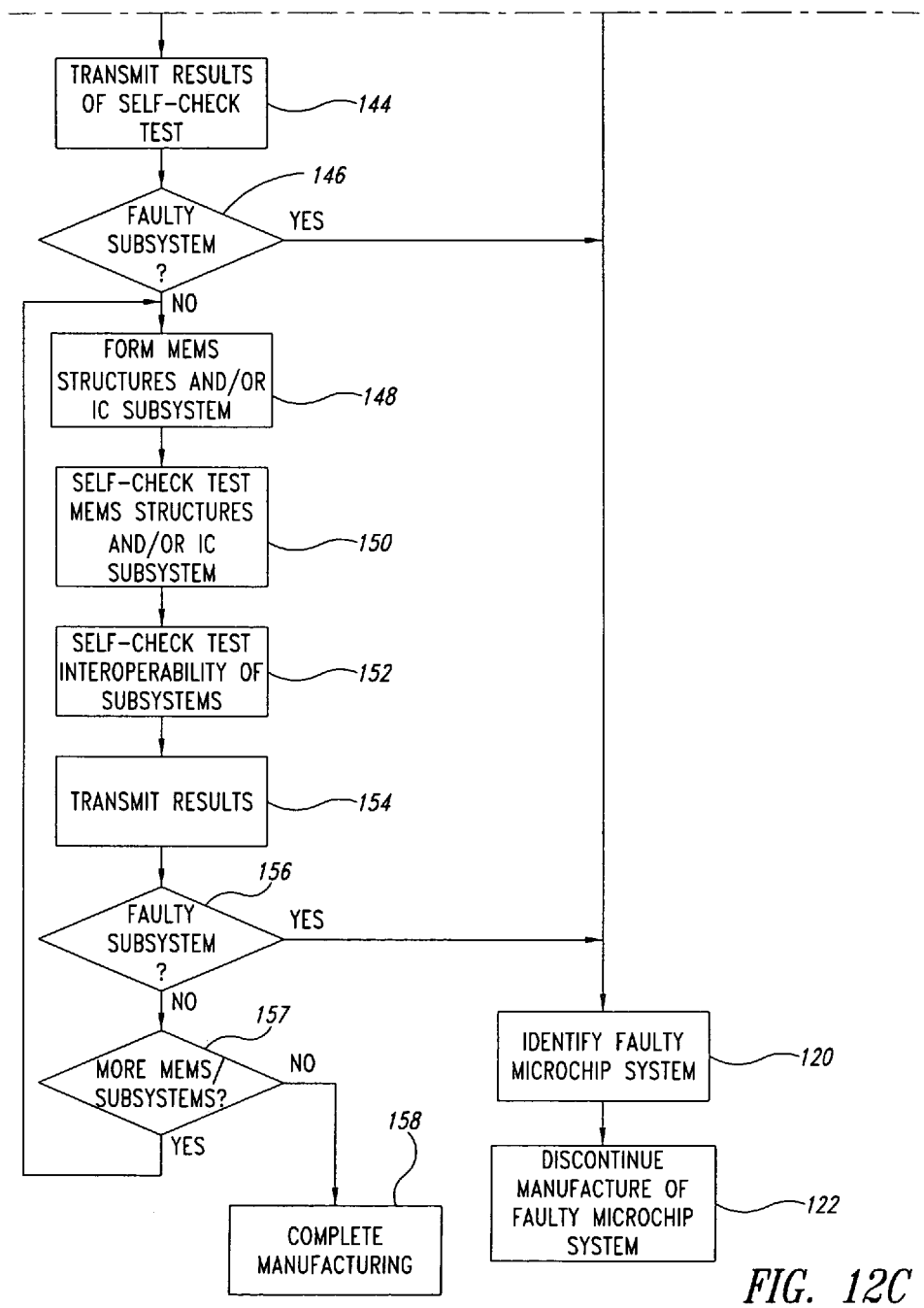

FIGS. 12A–12C show a method 100a of manufacturing a microchip system according to one illustrated embodiment, starting at 102. The method 100a is discussed with reference to various elements of the microchip system 10a illustrated in FIG. 1A, microchip system 10c illustrated in FIG. 3A, and the manufacturing environment 70 illustrated in FIG. 10.

At 104, the substrate 12 is provided in the manufacturing environment 72 (FIG. 10). At 106a, the various manufacturing devices 72a–72c form the control subsystem 20a, 20c on the substrate 12. At 108a, the various manufacturing devices 72a–72c form the communications subsystem 16a, 16c on the substrate 12. Optionally at 110a, the various manufacturing devices 72a–72c form the antenna 14a, 14c on the substrate 12. At 112, the control subsystem 20a, 20c performs a self check test of itself. At 114, the control subsystem 20a, 20c performs a self check test of the communications subsystem 16a 16c. At 116, the communications subsystem 16a, 16c transmits results of the self check test via the antenna 14a, 14c.

At 118, the manufacturing computing system 74i determines if there is a faulty subsystem. If a faulty subsystem exists, at 120 the manufacturing computing system 74i identifies the faulty microchip system 10a, and at 122 discontinues manufacture of the faulty microchip system 10a. If a faulty subsystem does not exist, control passes to 132a.

At 132a the manufacturing devices 72a–72c form an interface subsystem 24a, 24c on the substrate 12. At 134, the control subsystem 20a, 20c performs a self check test of the interface subsystem 24a, 24c. At 136, the communications subsystem 16a, 16c transmits the results of the self check test via the antenna 14a, 14c.

At 138, the manufacturing computing system 74i determines if a faulty subsystem exists. If a faulty subsystem exists, the manufacturing computing system 74i identifies the faulty microchip system 10a, 10c at 120 and discontinues manufacture the faulty microchip system 10a, 10c at 122. If a faulty subsystem does not exist, control passes to 140a.

At 140a, the manufacturing devices 72a–72c form the passive power subsystem 18a, 18c on the substrate 12. At 142, the control subsystem 20a, 20c performs a self check test on the passive power system 18a, 18c. At 144, the communications subsystem 16a, 16c transmits results of the self check test via antenna 14a, 14c.

At 146, the manufacturing computing system 74i determines if a faulty subsystem exists. If a faulty subsystem exists, the manufacturing computing system 74i identifies the faulty microchip system 10a, 10c at 120 and discontinues manufacture of the faulty microchip system 10a, 10c at 122. If a faulty subsystem does not exist, control passes to 148.

At 148, the manufacturing devices 72a–72c form a subsystem 25a–25c of the integrated circuit and/or a MEMS device 26 on the substrate 12. At 150, the control subsystem 20a, 20c performs a self check test of the subsystem 25a–25c and/or MEMS device 26. Optionally at 152, the control subsystem 20a, 20c performs a self check test of the interoperability of the various subsystems 16a, 16c, 18a, 18c, 20a, 20c, 24a, 24c, 25a–25c, 26. The self check test of interoperability of subsystems may be performed following each self check test of the individual subsystems, or after one, more or all subsystems are formed. At 154, the communications subsystem 16a, 16c transmits results of the self check test via the antenna 14a, 14c.

At 156, the manufacturing computing system 74i determines if there is a faulty subsystem or interoperability problem with the microchip system 10a, 10c. If a subsystem is faulty or the interoperability of the subsystems is faulty, the manufacturing computing device 74a identifies the faulty microchip system 10a, 10c at 120 and discontinues manufacture of the faulty microchip system 10a, 10c at 122. If the subsystems and interoperability of the subsystems are not faulty, the manufacturing computing system 74i determines at 157 whether there are additional or further subsystems 25a–25c of the integrated circuit 25 or MEMS devices 26 to manufacture. If the manufacturing computing system 74i determines that there are additional subsystems 25a–25c of the integrated circuit 25 and/or MEMS devices 26 to manufacture, control passes back to 148 to form and test the next subsystems 25a–25c and/or MEMS devices 26. Otherwise, manufacturing is completed at 158.

Figure 13A:
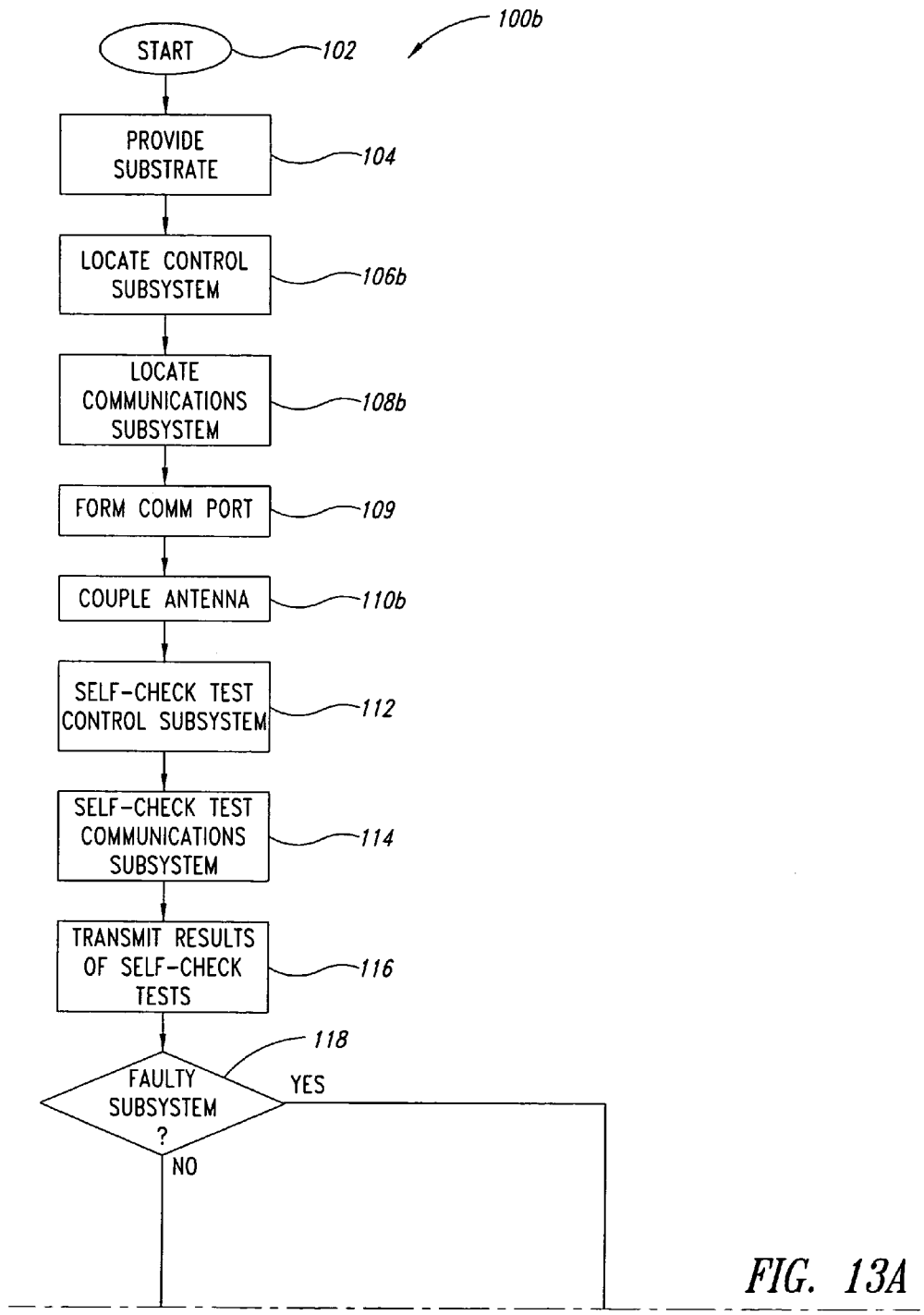
FIGS. 13A–13C are a flow diagram of a method of manufacturing a lab-on-chip system of FIGS. 3A and 3B according to another illustrated embodiment.
Figure 13B:
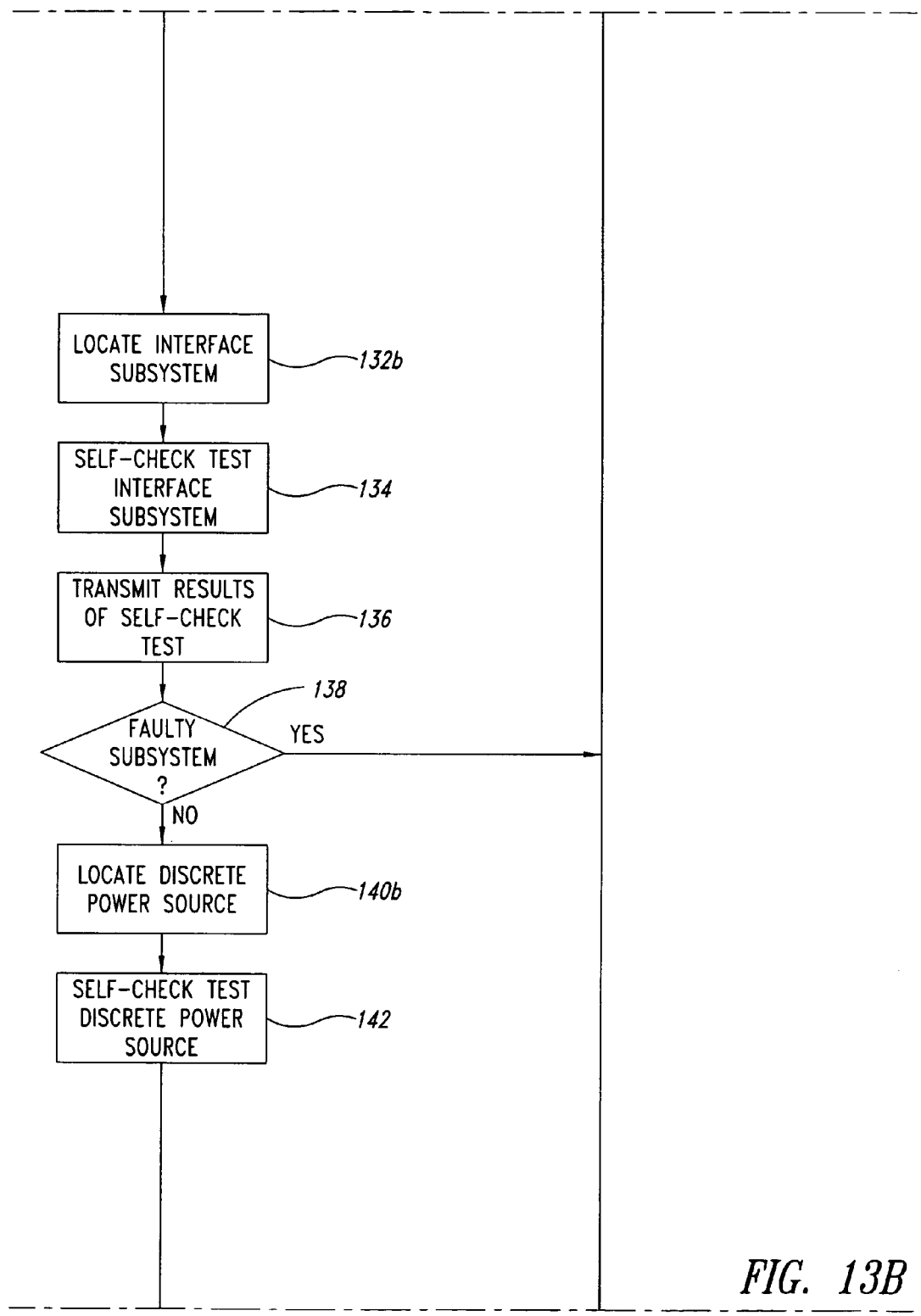
Figure 13C:
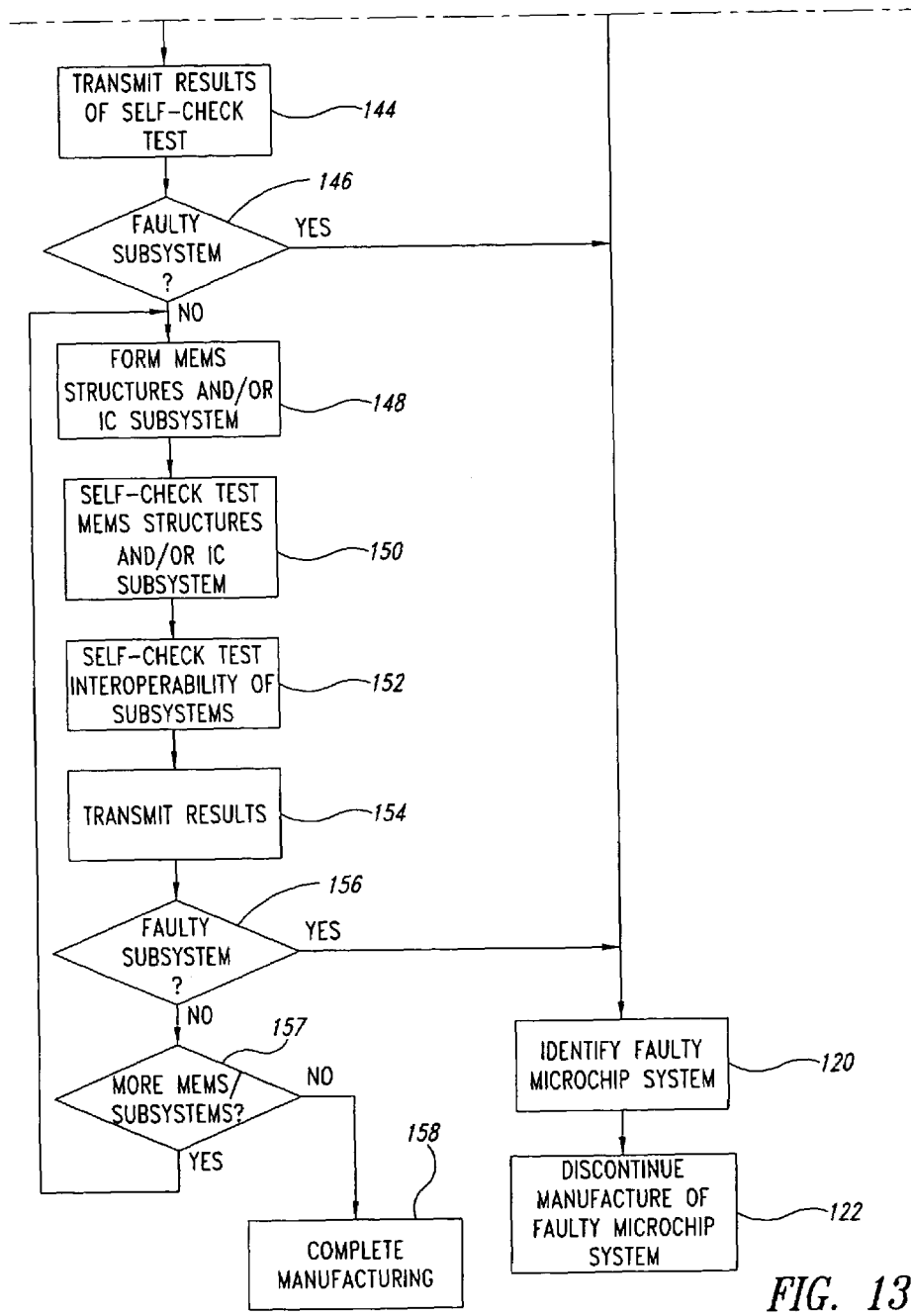

FIGS. 13A–13C show a method 100b of manufacturing a microchip system according to one illustrated embodiment, starting at 102. The method 100b is discussed with reference to various elements of the microchip systems 10b illustrated in FIG. 3A, microchip system 10d illustrated in FIGS. 3B and 4, as well as the manufacturing environment 70 illustrated in FIG. 10. Many of the acts in the method 100b are similar or identical to those of method 100a, thus common reference numerals are used to identify such. The method 100b assumes that each subsystem is provided independently. In some embodiments, some or all of the subsystems may be provided as a single integrated circuit, which may be packaged or unpackaged.

At 104, the substrate 12 is provided in the manufacturing environment 72 (FIG. 10). At 106b, manufacturing devices such as pick and place machinery 72d locate the control subsystem 20b, 20d on the substrate 12. At 108b, manufacturing devices such as pick and place machinery 72d locate the communications subsystem 16b, 16d on the substrate 12.

At 109, a communications port 28 is formed in the substrate 12, for example, using the various manufacturing devices 72a–72d. At 110b, manufacturing devices such as pick and place machinery 72d couple the antenna 14b, 14d to the communications port 28. At 112, the control subsystem 20b, 20d performs a self check test of itself. At 114, the control subsystem 20b, 20d performs a self check test of the communications subsystem 16b, 16d. At 116, the communications subsystem 16b, 16d transmits results of the self check test via the antenna 14b, 14d.

At 118, the manufacturing computing system 74i determines if there is a faulty subsystem. If a faulty subsystem exists, at 120 the manufacturing computing system 74i identifies the faulty microchip system 10b, 10d, and at 122 discontinues manufacture of the faulty microchip system 10b, 10d. If a faulty subsystem does not exist, control passes to 132b.

At 132b, manufacturing devices such as pick and place machinery 72d locate an interface subsystem 24b, 24d on the substrate 12. At 134, the control subsystem 20b, 20d performs a self check test of the interface subsystem 24b, 24d. At 136, the communications subsystem 16b, 16d transmits the results of the self check test via the antenna 14b, 14d.

At 138, the manufacturing computing system 74i determines if a faulty subsystem exists. If a faulty subsystem exists, the manufacturing computing system 74i identifies the faulty microchip system 10b, 10d at 120 and discontinues manufacture of the faulty microchip system 10b, 10d at 122. If a faulty subsystem does not exist, control passes to 140b.

At 140b, manufacturing devices such as pick and place machinery 72d locate the discrete power source 18b, 18d on the substrate 12. At 142, the self check subsystem 22b performs a self check test on the discrete power source 18b, 18d, for example checking for charge, voltage and/or electrical continuity. At 144, the communications subsystem 16b, 16d transmits results of the self check test via antenna 14b, 14d.

At 146, the manufacturing computing system 74i determines if a faulty subsystem exists. If a faulty subsystem exists, the manufacturing computing system 74i identifies the faulty microchip system 10b, 10d at 120 and discontinues manufacture of the faulty microchip system 10b, 10d at 122. If a faulty subsystem does not exist, control passes to 148.

At 148, the manufacturing devices 72a–72c form a subsystem 25a–25c of the integrated circuit and/or a MEMS device 26 on the substrate 12. At 150, the control subsystem 20b, 20d performs a self check test of the subsystem 25a–25c and/or MEMS device 26. Optionally, at 152, the control subsystem 20b, 20d performs a self check test of the interoperability of subsystems 16b, 16d, 18b, 18d, 20b, 20d, 24b, 24d, 25a–25c, 26. The self check test of interoperability of subsystems may be performed following each self check test of the individual subsystems, or after one, more or all subsystems are formed. At 154, the communications subsystem 16b, 16d transmits results of the self check test via the antenna 14b, 14d.

At 156, the manufacturing computing system 74i determines if there is a faulty subsystem or interoperability problem with the microchip system 10b, 10d. If a subsystem is faulty or the interoperability of the subsystems is faulty, the manufacturing computing device 74a identifies the faulty microchip system 10b, 10d at 120 and discontinues manufacture of the faulty microchip 10b at 122. If the subsystems and interoperability of the subsystems are not faulty, the manufacturing computing system 74i determines at 157 whether there are additional or further subsystems 25a–25c of the integrated circuit 25 or MEMS devices 26 to manufacture. If the manufacturing computing system 74i determines that there are additional subsystems 25a–25c of the integrated circuit 25 and/or MEMS devices 26 to manufacture, control passes back to 148 to form and test the next subsystems 25a–25c and/or MEMS devices 26. Otherwise, manufacturing is completed at 158.

In methods 100a, 100b, the act of discontinuing manufacture 122 may be replaced with a return to the corresponding forming or locating of the subsystem. This would allow replacement subsystems to be formed where a faulty subsystem is detected, should there be sufficient space on the substrate and should such be economical.

Figure 14:
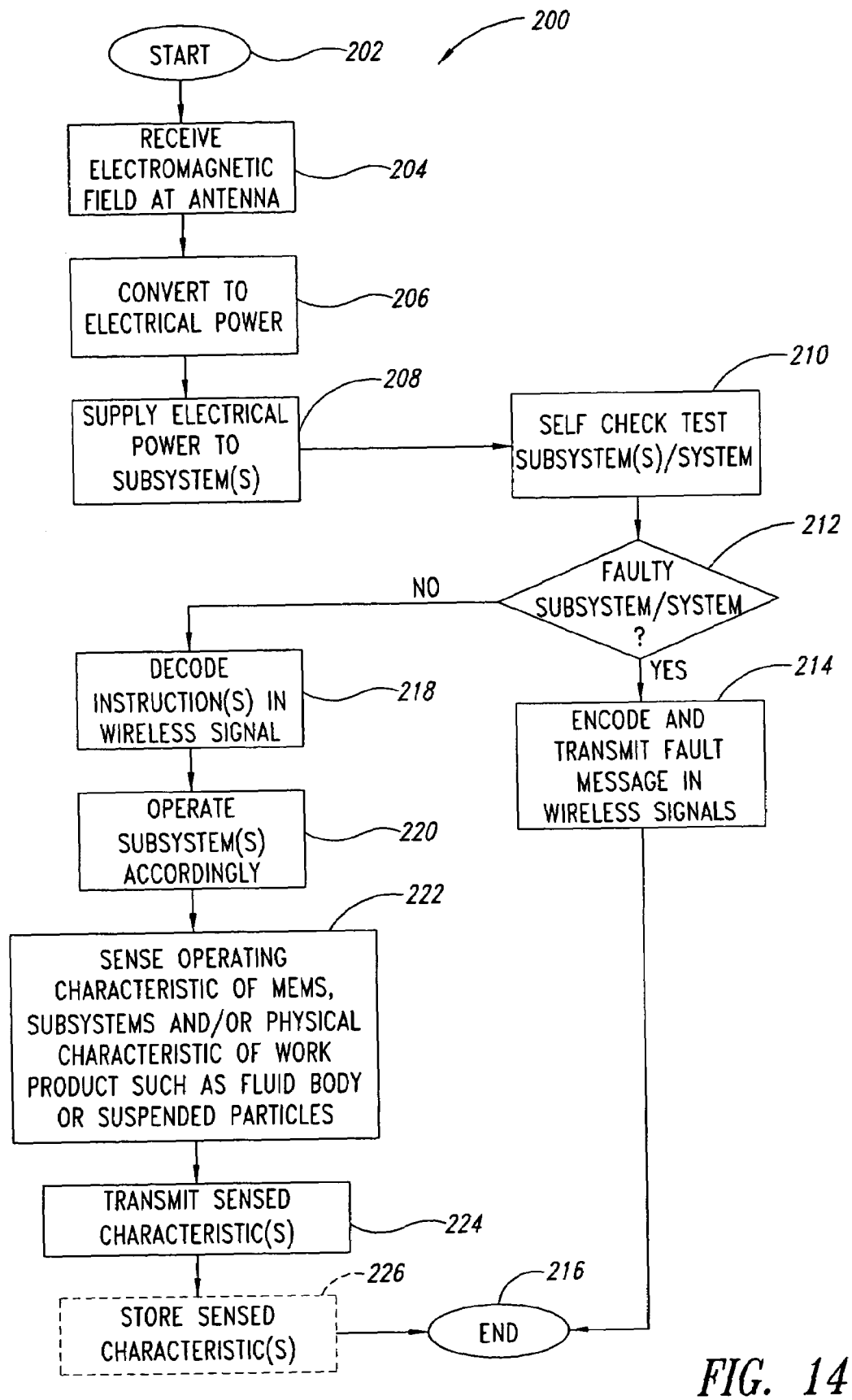
FIG. 14 is a flow diagram illustrating a method of operating a lab-on-chip system according to one illustrated embodiment.

FIG. 14 shows a method 200 of operating a microchip 10 according to one illustrated embodiment, starting at 202. The method 200 is discussed with reference to various elements of the microchip systems 10a–10d (collectively 10) illustrated in FIGS. 1A, 1B, 3A, 3B and the laboratory environment 76 illustrated in FIG. 11.

At 204, an electromagnetic field is received at the antenna 14a–14d (collectively 14) of the microchip 10. The electromagnetic field may, for example, take the form of a wireless signal, such as a radio frequency (RF) signal. At 206, the passive power subsystem 18a, 18c, if any, converts the electromagnetic field to electric power. At 208, the passive power subsystem 18a, 18c supplies electrical power to one or more of the other subsystems 16a 16c, 20a, 20c, 24a, 24c, 25a–25c, 26. Alternatively, the discrete power source 18b, 18d may supply power to one or more of the other subsystems 16b, 16d, 20b, 20d, 24b, 24d, 25a–25c, 26.

At 210, the control subsystem 20a–20d (collectively 20) may optionally perform a self check of one or more of the subsystems and/or interoperability of the subsystems. At 212, the control subsystem 20 determines if there is a faulty subsystem or if the interoperability of the subsystems is faulty. If a fault is detected, at 214 the communications subsystem 16a–16d (collectively 16) encodes and transmits a fault message via the antenna 14 and the method terminates at 216.

If the subsystems and microchip 10 are not faulty, the control system 20 decodes instructions, if any, contained in the electromagnetic field. At 220, the control subsystem 20 controls operation of the various subsystems according to instructions previously provided or received via the wireless signals.

At 222, one or more sensors, if any, sense operating characteristics of the MEMS and/or physical characteristics of the work product such as fluid body 34 or particles 46 suspended in the fluid body 34. At 224, the communications subsystem 16 encodes and transmits the sensed characteristics to the analysis computing system 78c via the antenna 14, antenna 78a, and transceiver 78b. Additionally or alternatively, the control subsystem 20 saves the sensed characteristics to memory on the microchip system 10 at 226.

As discussed above, certain embodiments may provide distinct advantages over conventional microchip systems. For example, self check testing allows faults to be discovered during manufacturing or during use. By combining the self checking test with a modular approach to manufacturing, defects may be detected and manufacturing operations ceased or revised to eliminate useless manufacturing operations, thereby reducing costs and/or increasing manufacturing throughput. For example, fatal defects in an earlier manufactured subsystem may be caught before subsequent subsystems are manufactured. The microchip 10 with the faulty subsystem may be marked or otherwise identified and further manufacturing operations on the particular microchip system avoided. Alternatively, a substitute subsystem for the faulty subsystem may be manufactured or activated (e.g., coupled into with the other subsystems, for example, during the manufacture of those other subsystems). Discovering faults before or during operation may allow experiments or operation to not be started or ceased before significant amounts of time have pasted, particular where the microchip system is unlikely to produce reliable results. Other microchip systems may be timely substituted for the faulty microchip system. Additionally, or alternatively, substitute subsystems may be made operational or coupled into the system to replace faulty ones.

Also for example, use of wireless transmission may eliminate the need for complicated and costly physical connections. The use of a passive power subsystem may extend the useful life of the microchip system, since such will not depend on the life of a battery. The use of wireless transmission may also allow control over the operation of the microchip system, include reprogramming. Further, the use of wireless communications significantly enhances the ability toe perform self check testing in the manufacturing environment, where physical connections would be difficult, if even possible.

The above description of illustrated embodiments, including what is described in the Abstract, is not intended to be exhaustive or to limit the invention to the precise forms disclosed. Although specific embodiments of and examples are described herein for illustrative purposes, various equivalent modifications can be made without departing from the spirit and scope of the invention, as will be recognized by those skilled in the relevant art. The teachings provided herein of the invention can be applied to other integrated circuit and/or MEMS devices, not necessarily the exemplary MEMS devices generally described above. The microchip system may include fewer or additional subsystems, and elements from one embodiment may be used with other embodiments. For example, some of the subsystems of a microchip system 10 may be integrally formed with each other, while other ones of the subsystems are provided as discrete packages. For example, the control and interface subsystems 20, 24 may be formed as a an integrated circuit on the substrate 12, while the communications subsystem 16 and/or passive power subsystem 18a, 18c may be formed as one or more discrete components and located on the substrate.

The foregoing detailed description has set forth various embodiments of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one embodiment, the present subject matter may be implemented via Application Specific Integrated Circuits (ASICs). However, those skilled in the art will recognize that the embodiments disclosed herein, in whole or in part, can be equivalently implemented in standard integrated circuits, as one or more computer programs running on one or more computers (e.g., as one or more programs running on one or more computer systems), as one or more programs running on one or more controllers (e.g., microcontrollers) as one or more programs running on one or more processors (e.g., microprocessors), as firmware, or as virtually any combination thereof, and that designing the circuitry and/or writing the code for the software and or firmware would be well within the skill of one of ordinary skill in the art in light of this disclosure.

In addition, those skilled in the art will appreciate that some of the mechanisms taught herein are capable of being distributed as a program product in a variety of forms, and that an illustrative embodiment applies equally regardless of the particular type of signal bearing media used to actually carry out the distribution. Examples of signal bearing media include, but are not limited to, the following: recordable type media such as floppy disks, hard disk drives, CD ROMs, digital tape, and computer memory; and transmission type media such as digital and analog communications links using TDM or IP based communications links (e.g., packet links).

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, including but not limited to U.S. provisional patent application Ser. No. 60/492,123, filed Aug. 1, 2003; U.S. provisional patent application Ser. No. 60/492,125, filed Aug. 1, 2003; U.S. Pat. No. 6,429,775; U.S. Pat. No. 5,808,587; U.S. Pat. No. 5,973,598; U.S. Pat. No. 6,294,997; and/or U.S. application Ser. No. 10/909,920 filed currently with this application and entitled LAB-ON-CHIP SYSTEM AND METHOD AND APPARATUS FOR MANUFACTURING AND OPERATING SAME, are incorporated herein by reference, in their entirety. Aspects of the invention can be modified, if necessary, to employ systems, circuits and concepts of the various patents, applications and publications to provide yet further embodiments of the invention.

These and other changes can be made to the invention in light of the above-detailed description. In general, in the following claims, the terms used should not be construed to limit the invention to the specific embodiments disclosed in the specification and the claims, but should be construed to include all microchip systems; methods of manufacturing and/or operating microchip systems and/or devices or systems for manufacturing and/or operating microchip systems that operated in accordance with the claims. Accordingly, the invention is not limited by the disclosure, but instead its scope is to be determined entirely by the following claims.

We claim:

1. A microchip system, comprising:
   a substrate;
   a control subsystem carried by the substrate and operable to perform a self test of at least one subsystem of the microchip system;
   an antenna; and
   a communications subsystem carried by the substrate, the communications subsystem coupled to the antenna and operable to wirelessly transmit self check information resulting from the self test after manufacturing of at least one subsystem from the microchip system and before a last step of manufacturing of the microchip system.

2. The microchip system of claim 1 wherein the control subsystem is operable to perform a self test on the communications subsystem.

3. The microchip system of claim 1, further comprising:
   a passive power subsystem carried by the substrate and coupled to the antenna to receive power thereby in the form of an electromagnetic field and coupled to provide power to at least one other subsystem of the microchip system.

4. The microchip system of claim 1, further comprising:
   a power storage device carried by the substrate and coupled to provide power to at least one subsystem of the microchip system.

5. The microchip system of claim 1, further comprising:
   at least a first micro-electrical-mechanical structure formed on at least a first portion of the substrate, the first micro-electrical-mechanical structure operable to perform at least one physical action on at least one physical work product, wherein the control subsystem is operable to perform a self test of the first micro-electrical-mechanical structure.

6. The microchip system of claim 5, further comprising:
   a second micro-electrical-mechanical structure formed on at least a second portion of the substrate prior to the first micro-electrical-mechanical structure being formed on the first portion of the substrate, the second micro-electrical-mechanical structure being non-operable to perform at least one physical action on at least one physical work product.

7. The microchip system of claim 6 wherein the control subsystem is operable to perform a self test of the second micro-electrical-mechanical structure, and wherein the self test of the second micro-electrical-mechanical structure reveals the second micro-electrical-mechanical structure is faulty.

8. The microchip system of claim 1, further comprising:
   at least a first subsystem of an integrated circuit system formed on the substrate, wherein the control subsystem is operable to perform a self test of the first subsystem of the integrated circuit system.

9. The microchip system of claim 8, further comprising:
at least a second subsystem of the integrated circuit system formed on the substrate, wherein the control subsystem is configured to perform a self check of the first subsystem of the integrated circuit after the first subsystem of the integrated circuit is formed on the substrate and before the second subsystem of the integrated circuit system is formed on the substrate, and to perform a self check of the second subsystem of the integrated circuit after the second subsystem of the integrated circuit is formed on the substrate.

10. The microchip system of claim 1 wherein the control subsystem is configured to perform a self check of each of a number of the subsystems after each of at least one manufacturing operation is performed in manufacturing the microchip system.

11. The microchip system of claim 1 wherein the control subsystem is configured to perform a self check of each of a number of the subsystems after each of at least two manufacturing operations is performed in manufacturing the microchip system.

12. The microchip system of claim 1 wherein control subsystem comprises a memory coupled to the antenna to store a self check routine received via the antenna.

13. The microchip system of claim 1 wherein the antenna is carried by the substrate.

14. The microchip system of claim 1, further comprising:
a communications port, wherein the antenna is communicatively coupled to the communications port and the antenna is not carried by the substrate.

15. The microchip system of claim 1, further comprising:
an integrated circuit system formed on the substrate, the integrated circuit system having a first subsystem and a second subsystem, wherein the control subsystem is configured to perform a self check of the first subsystem of the integrated circuit after the first subsystem of the integrated circuit is formed on the substrate and before the second subsystem of the integrated circuit system is formed on the substrate, and to perform a self check of the second subsystem of the integrated circuit after the second subsystem of the integrated circuit is formed on the substrate, wherein the self test of the first subsystem reveals the first subsystem is faulty, and where the second subsystem functionally replaces the first subsystem.

16. A method of operating a microchip system; comprising:
performing at least a first self check test after manufacturing of at least one subsystem at a first time with a control subsystem carried by the substrate and before a last step of manufacturing of the microchip system; and
wirelessly transmitting results of the first self check test from the microchip system.

17. The method of claim 16, comprising:
forming the control subsystem on the substrate; and
performing a self check test of the control subsystem after forming the control subsystem on the substrate.

18. The method of claim 16, comprising:
forming the control subsystem on the substrate;
forming a communications subsystem on the substrate; and
performing a self check test of the communications subsystem with the control subsystem.

19. The method of claim 16, comprising:
forming the control subsystem on the substrate;
forming a communications subsystem on the substrate;
forming an antenna on the substrate the antenna communicatingly coupled to the communications subsystem; and
performing a self check test of the communications subsystem with the control subsystem after forming the communications subsystem and the antenna on the substrate.

20. The method of claim 16, comprising:
locating a communications subsystem on the substrate; and
performing a self check test of the communications subsystem with the control subsystem after locating the communications subsystem on the substrate.

21. The method of claim 20, comprising:
coupling an off substrate antenna to the communications system.

22. The method of claim 16, comprising:
forming a first subsystem of an integrated circuit system on the substrate; and
performing a self check test of the first subsystem of the integrated circuit system with a control subsystem carried by the substrate after forming the first subsystem of the integrated circuit system on the substrate.

23. The method of claim 22, comprising:
terminating manufacture of the microchip system before forming a second subsystem of the integrated circuit system on the substrate if the first subsystem of the integrated circuit system is faulty.

24. The method of claim 22, comprising:
forming a second subsystem of an integrated circuit system on the substrate after performing a self check test of the first subsystem of the integrated circuit system, if the first subsystem of the integrated circuit system is not faulty; and
performing a self check test of the second subsystem of the integrated circuit system with the control subsystem after forming the second subsystem of the integrated circuit system on the substrate.

25. The method of claim 24, comprising:
performing a self check test of an interoperability of the first and the second subsystems of the integrated circuit system after forming the first and the second subsystems of the integrated circuit system on the substrate.

26. The method of claim 25, comprising:
forming a third subsystem of an integrated circuit system on the substrate after performing a self check test of the second subsystem of the integrated circuit system, if the first and the second subsystems of the integrated circuit system is not faulty and if the interoperability of the first and the second subsystems of the integrated circuit subsystem is not faulty; and
performing a self check test of the third subsystem of the integrated circuit system with the control subsystem after forming the third subsystem of the integrated circuit system on the substrate.

27. The method of claim 22, comprising:
forming an interface subsystem on the substrate, the interface subsystem couplable to interface between a control subsystem carried by the substrate and at least a portion of the integrated circuit system; and
performing a self check test of the interface subsystem with the control subsystem after forming the interface subsystem on the substrate.

28. The method of claim 24, comprising:
forming a third subsystem of an integrated circuit system on the substrate after performing a self check test of the second subsystem of the integrated circuit system, if the first and the second subsystems of the integrated circuit system is not faulty; and performing a self check test of the third subsystem of the integrated circuit system with the control subsystem after forming the third subsystem of the integrated circuit system on the substrate.

29. The method of claim 16, comprising:

forming at least one micro-electrical-mechanical structure on the substrate; and performing a self test of the at least one micro-electrical-mechanical structure after forming the at least one micro-electrical-mechanical structure on the substrate.

30. The method of claim 29, comprising:

forming an interface subsystem on the substrate, the interface subsystem couplable to provide an interface between a control subsystem carried by the substrate and the at least one micro-electrical-mechanical structure of the substrate; and performing a self check test of the interface subsystem with the control subsystem after forming the interface subsystem on the substrate.

31. The method of claim 16, comprising:

receiving an electromagnetic field at an antenna;

converting the electromagnetic field into electrical power; and providing the electrical power to at least one subsystem of the microchip system.

32. The method of claim 31 wherein providing the electrical power to at least one subsystem of the microchip system comprises supplying a portion of the electrical power to the control subsystem.

33. The method of claim 16 wherein performing at least a first self check test comprises performing a respective self check test after forming each of a plurality of subsystems on the substrate.

34. The method of claim 16 wherein performing at least a first self check test occurs between a start and a finish of a manufacturing of the microchip system.

35. The method of claim 16 wherein performing at least a first self check test occurs in an operational environment after completion of manufacturing of the microchip system.

36. The method of claim 16, further comprising:

forming a replacement subsystem on the substrate for the at least one subsystem if the at least one subsystem is faulty.

37. The method of claim 16, further comprising:

forming a replacement subsystem on the substrate for the at least one subsystem of the integrated circuit system if the at least one subsystem of the integrated circuit system is faulty.

38. A microchip system, comprising:

a substrate;

at least a first subsystem having a first micro-electrical-mechanical structure formed on at least a first portion of the substrate, the first micro-electrical-mechanical structure operable to perform at least one physical action on at least one physical work product;

a control subsystem carried by the substrate and operable to perform a self test of the first subsystem, wherein the self test of the first subsystem is performed during manufacturing of the microchip system and prior to manufacturing a subsequent second subsystem on the microchip system;

an antenna; and a communications subsystem carried by the substrate, the communications subsystem coupled to the antenna and operable to wirelessly transmit self check information resulting from the self test after manufacturing of the first micro-electrical-mechanical structure and prior to complete manufacturing of the microchip system.

* * * * *